(12) United States Patent
Benjamin et al.

(10) Patent No.: US 8,692,467 B2
(45) Date of Patent: Apr. 8, 2014

(54) SYNCHRONIZED AND SHORTENED MASTER-SLAVE RF PULSING IN A PLASMA PROCESSING CHAMBER

(75) Inventors: Neil Martin Paul Benjamin, East Palo Alto, CA (US); Arthur H. Sato, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 287 days.

(21) Appl. No.: 13/177,486

(22) Filed: Jul. 6, 2011

(65) Prior Publication Data

US 2013/0009545 A1    Jan. 10, 2013

(51) Int. Cl.
*H01J 7/24* (2006.01)

(52) U.S. Cl.
USPC ...... 315/111.21; 315/308; 315/360; 315/344; 118/723 I; 118/723 E (58) Field of Classification Search
USPC ............... 315/111.21, 111.71, 311, 344, 307, 315/308, 360; 118/723 I, 723 E; 427/569; 438/707, 710
See application file for complete search history.

(56) References Cited

U.S. PATENT DOCUMENTS

| | | | |
|---|---|---|---|
| 4,891,118 A | 1/1990 | Ooiwa et al. | |
| 5,013,578 A | 5/1991 | Brown et al. | |
| 5,160,397 A | 11/1992 | Doki et al. | |
| 5,231,057 A | 7/1993 | Doki et al. | |
| 5,310,452 A | 5/1994 | Doki et al. | |
| 5,558,718 A | 9/1996 | Leung et al. | |
| 5,888,414 A | 3/1999 | Collins et al. | |
| 5,928,528 A | 7/1999 | Kubota et al. | |
| 6,010,603 A | 1/2000 | Ye et al. | |
| 6,030,667 A | 2/2000 | Nakagawa et al. | |
| 6,368,678 B1 * | 4/2002 | Bluck et al. | 427/569 |
| 6,444,137 B1 | 9/2002 | Collins et al. | |
| 6,589,437 B1 | 7/2003 | Collins et al. | |
| 6,755,150 B2 * | 6/2004 | Lai et al. | 118/723 I |
| 6,794,301 B2 | 9/2004 | Savas et al. | |
| 6,875,700 B2 | 4/2005 | Kanakasabapathy et al. | |
| 6,902,646 B2 | 6/2005 | Mahoney et al. | |
| 7,645,710 B2 | 1/2010 | Olsen et al. | |
| 7,678,710 B2 | 3/2010 | Chua et al. | |
| 7,785,486 B2 | 8/2010 | Urban et al. | |

(Continued)

OTHER PUBLICATIONS

"International Search Report", PCT Application No. PCT/US 12/45676, Mailing Date: Sep. 24, 2012.

(Continued)

*Primary Examiner* — Haiss Philogene
(74) *Attorney, Agent, or Firm* — Martine Penilla Group, LLP (57) ABSTRACT

Plasma processing apparatuses and techniques for processing substrates, which include the use of synchronized RF pulsing of a first RF signal and a delayed-and-shortened second RF signal. The first RF signal may be the primary plasma-generating RF signal and the second RF signal may be the RF bias signal or vice versa. Alternatively or additionally, the first RF signal may be the high frequency RF signal and the second RF signal may be the lower frequency RF signal. Either the first RF signal or the second RF signal may act as the master, with the other acting as the slave signal. Alternatively, an external circuit may be employed as a master to control both the first RF signal and the second RF signal as slave signals. Track-and-hold techniques and circuits are provided to ensure accurate measurement for process control and other purposes.

30 Claims, 5 Drawing Sheets

(56) References Cited

U.S. PATENT DOCUMENTS

| | | |
|---|---|---|
| 7,811,941 B1 | 10/2010 | Becker et al. |
| 7,837,838 B2 | 11/2010 | Chua et al. |
| 8,264,154 B2 * | 9/2012 | Banner et al. ............ 315/111.71 |
| 8,404,598 B2 * | 3/2013 | Liao et al. .................... 438/714 |
| 2002/0128039 A1 | 9/2002 | Finn |
| 2007/0066038 A1 | 3/2007 | Sadjadi et al. |
| 2009/0000942 A1 | 1/2009 | Bai et al. |
| 2009/0284156 A1 | 11/2009 | Banna et al. |
| 2009/0294061 A1 | 12/2009 | Shannon et al. |
| 2009/0298287 A1 | 12/2009 | Shannon et al. |
| 2011/0031216 A1 | 2/2011 | Liao et al. |

OTHER PUBLICATIONS

"Written Opinion", PCT Application No. PCT/US 12/45676, Mailing Date: Sep. 24, 2012.

* cited by examiner

FIG. 1
(PRIOR ARTS)

FIG. 2
(PRIOR ARTS)

SYNCHRONIZED AND SHORTENED MASTER-SLAVE RF PULSING IN A PLASMA PROCESSING CHAMBER

BACKGROUND OF THE INVENTION

Plasma has long been employed to process substrates (e.g., wafers or glass panels) to produce electronic products (e.g., integrated circuits or flat panel displays). In the processing of a substrate, plasma may be employed to etch or deposit material. Generally speaking, plasma processing involves disposing a substrate on a suitable work piece holder, such as a chuck. An RF (radio frequency) energy source may be employed to ignite a process source gas inside a plasma processing chamber, forming a plasma for processing the substrate. In the case of an inductively coupled plasma processing chamber, this RF plasma-generation energy source is typically implemented by an RF power supply supplying RF energy to an inductive coil. In the following discussion, wafers and inductively coupled plasma processing chambers are employed as examples. It should be understood, however, that the invention is not limited to these particular examples.

When the RF energy source is on, plasma can be generated and sustained, which may involve the generation of the charged species and radical neutral species. During processing, charged species from the plasma tend to impart an electrical charge on features on the substrate surface. This electrical charge on the wafer may, in some cases, undesirably result in the alteration of the desired topography of the features and may even lead to device damage. For example, charged species may be attracted to or repelled from the charged sidewalls of features on the wafer surface, resulting in undercut features after the etch is completed. The electrical charge on the wafer may also cause electrical stress among features and layers of the wafer. Furthermore, energetic charged and neutral species striking the charged wafer may cause structural damage (such as voids or dislocations) to features formed in the upper layer of the wafer.

When the RF energy to the inductive coil is turned off, the plasma enters an afterglow period during which, depending on the chemistry employed, may cause the wafer to continue to be processed (e.g., etched and/or deposited), albeit using a modified mechanism. The etching and/or deposition activity that occurs during the afterglow period has been successfully utilized in many processes to attenuate the potentially damaging effects of charged species striking the wafer, for example.

Once the species (both charged species and reactive neutral species) are expended or evacuated, only unenergized processed gases remain. In the absence of plasma enhanced species, processing tends to cease or proceed only minimally. Accordingly, useful processing in the afterglow state tends to be limited in duration.

Because of the beneficial effect of afterglow processing, pulsing has been employed to alternately turn the plasma on and off. Generally speaking, pulsing may be performed with either the source RF power supply (i.e., the RF power supply employed mainly for plasma ignition and sustaining) or the bias RF power supply that is employed to bias the chuck on which the wafer is disposed.

To clarify terminologies, in an inductive chamber, the RF energy source that supplies RF energy to the inductive coil tends to be the main plasma ignition and sustaining power supply. This power supply is referred to herein as the source RF power supply for inductively coupled chambers. On the other hand, the RF energy source that provides RF power to the chuck to primarily control the sheath voltage and ion energy is referred to herein as the bias RF power supply.

In a capacitively coupled chamber that employs multiple RF frequencies, the RF energy source that supplies the high frequency RF signal tends to be the main plasma ignition and sustaining power supply. This power supply is referred to herein as the source RF power supply for capacitively coupled chambers. On the other hand, the RF energy source that provides the lower frequency RF signal to the chuck to control the bias energy is referred to herein as the bias RF power supply.

If the plasma is pulsed, only the source RF power supply or only the bias RF power supply or both may be pulsed. If both RF power supplies are pulsed, the pulsing of both the source RF power supply and the bias RF power supply may be performed asynchronously or synchronously (and if synchronously, may be in phase or out of phase). In the prior art, the source RF power supply and the bias RF power supply tend to be pulsed both synchronously and in-phase. As the term is employed herein, two RF signals are said to be synchronous if there is a pulse of the first signal for every pulse of the second signal and vice versa. On the other hand, two RF signals are said to be in phase if their pulses have the same rising edge and lowering edge.

Figure 1:
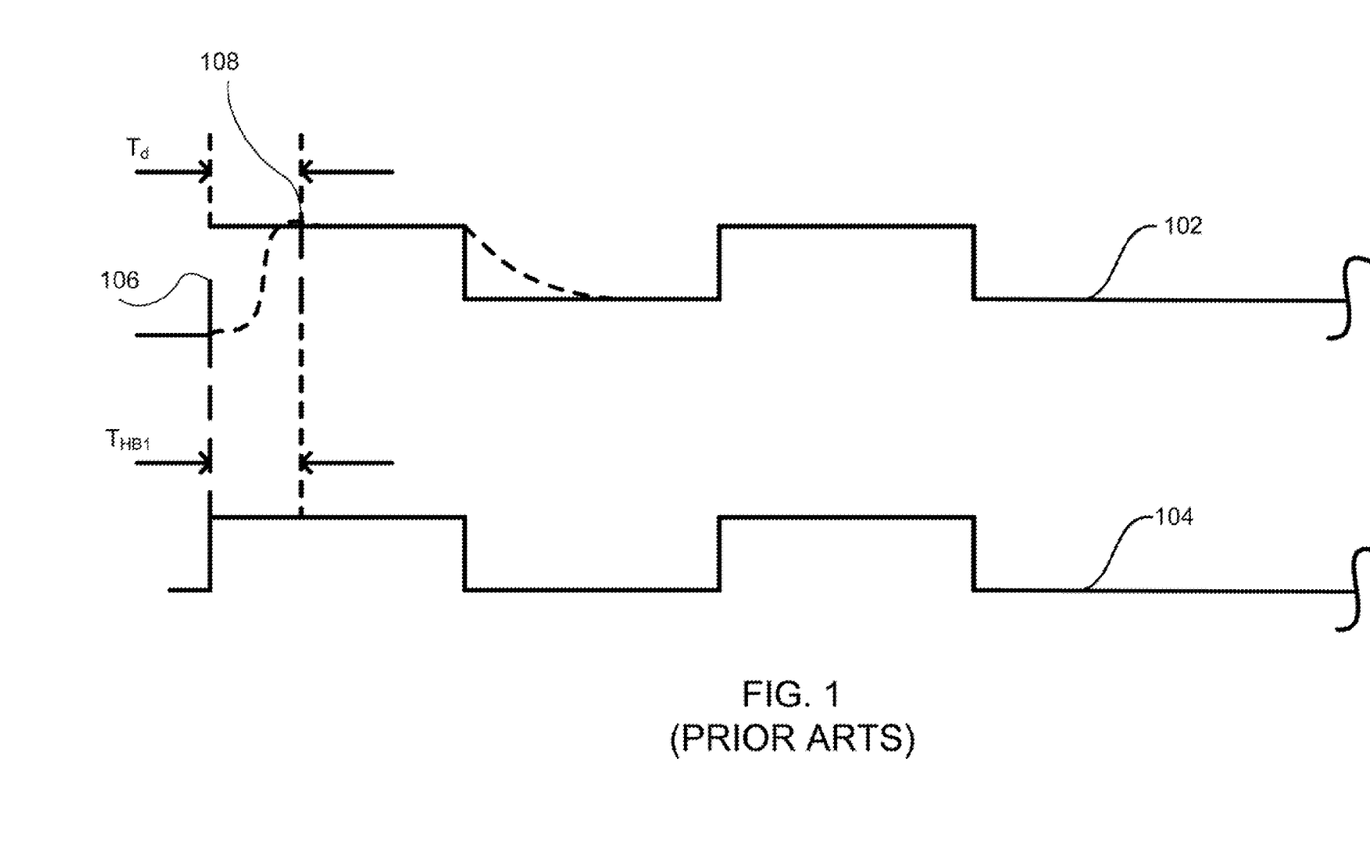
FIG. 1 shows two synchronous and in-phase RF signals to facilitate discussion.

FIG. 1 shows two synchronous and in-phase RF signals 102 and 104. RF signal 102 represents the source RF signal supplied by the source RF power supply for plasma ignition and sustaining while RF signal 104 represents the bias RF signal supplied by the bias RF power supply for controlling the sheath that exists between the plasma and the wafer during processing in order to control the energy of particles impacting the wafer. When source RF signal 102 is turned on (shown by reference 106), there exists a time delay, $T_d$, before the plasma ignites. Plasma ignition is denoted in FIG. 1 by reference number 108.

If the bias RF signal is on during the duration $T_d$ when no or little plasma exists in the chamber, the chuck may be unduly biased by the on state of the bias RF signal pulse. The high bias condition, which is characterized by a high bias voltage existing on the chuck in the absence of a high density plasma in the chamber, may cause particles and/or species to impact the chuck and/or the wafer at high velocity, leading to bombardment damage. The duration of this high bias condition is shown in FIG. 1 by the reference $T_{HB1}$.

Figure 2:
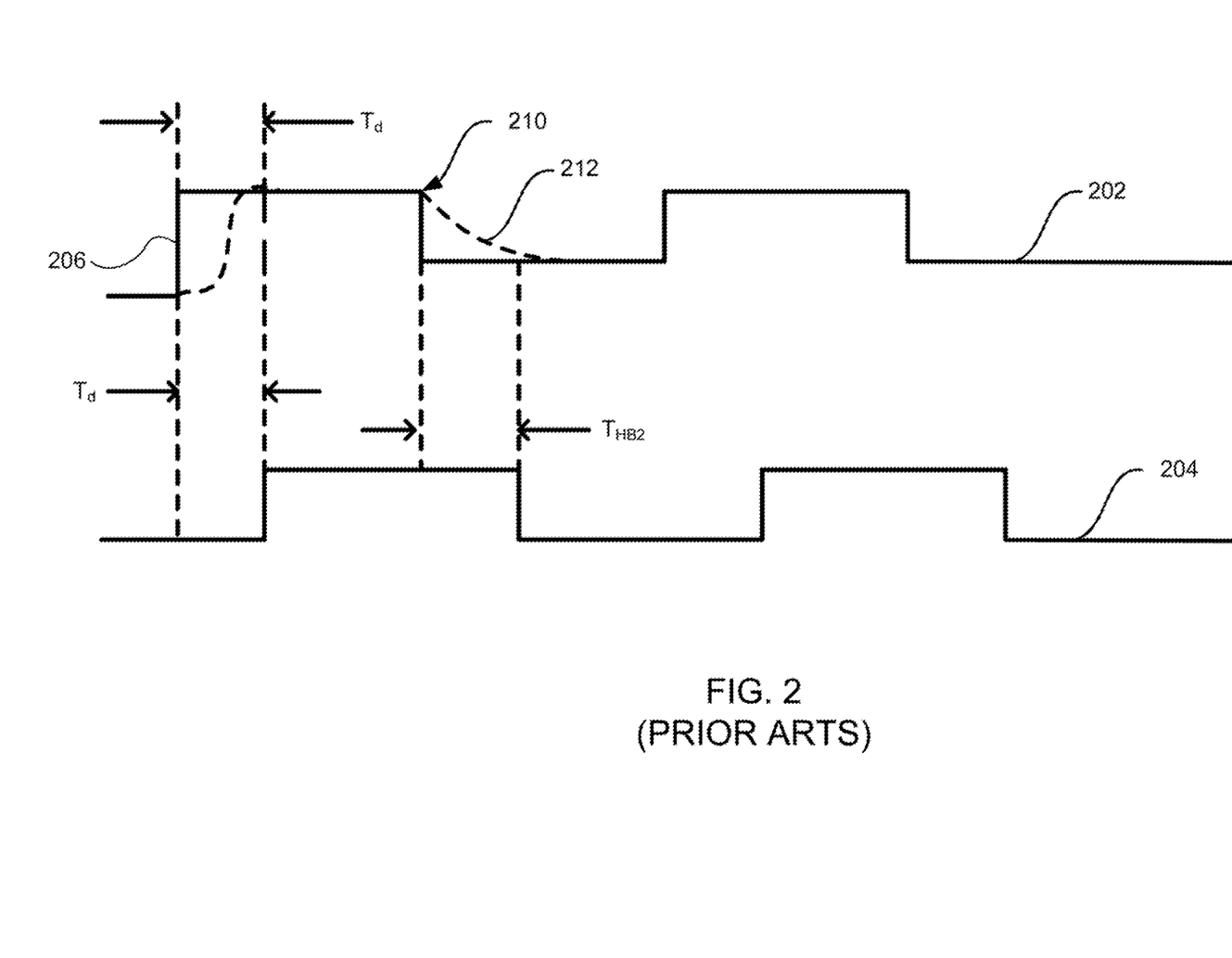
FIG. 2 illustrates the situation wherein the bias RF signal pulse is time shifted relative to the source RF signal pulse in an attempt to avoid the aforementioned high bias condition.

FIG. 2 illustrates the situation wherein the bias RF signal pulse is time shifted relative to the source RF signal pulse in an attempt to avoid the aforementioned high bias condition. In the example of FIG. 2, after the source RF signal 202 is turned on at edge 206, the plasma ignites after a delay period $T_d$. As before, source RF signal 202 is turned off after some time (as signified by reference number 210). After source RF signal is turned off at edge 210, the plasma in the chamber is extinguished except for the residual afterglow species which decay away as shown by reference number 212 as the chamber continues to be evacuated by exhaust pumping.

In FIG. 2, the bias RF signal pulse is delayed by a time period $T_d$ to ensure that the bias RF signal pulse is turned on only after high density plasma is ignited in order to avoid the aforementioned high bias condition. However, since the bias RF signal pulse is kept at the same duration (e.g., the bias RF signal pulse is phase-shifted to account for the ignition delay but its pulse has the same duration as the source RF signal pulse), the same high bias condition may exist after the source RF power supply is turned off. This is because the presence of bias RF signal pulse on the chuck when high density plasma is no longer actively generated in the chamber may result in the aforementioned high bias condition (shown in FIG. 2 by the reference $T_{HB2}$). This high bias condition, as mentioned, may potentially damage the wafer and/or the chuck due to excessive bombardment.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with one or more embodiments of the invention, the bias RF signal pulse is both time delayed and shortened in order to ensure that the bias RF signal pulse is present only when plasma is actively generated by the source RF signal. To prevent the bias RF signal from being turned on prior to the ignition of the plasma, the bias RF signal pulse is delayed by at least a period $T_d$ to ensure that the bias RF signal is turned on only after there is a high density plasma in the chamber. Likewise, to prevent the undesirable high bias condition, the bias RF signal is turned off before the plasma has transitioned to an afterglow phase. Thus, the bias RF signal can be on anytime after the ignition of the plasma and before the plasma transition into the afterglow phase.

In an embodiment of the invention, a track-and-hold technique may be employed to determine the parameters associated with the synchronized and shortened pulses, thereby improving the accuracy and providing better information for process control and troubleshooting, for example.

The features and advantages of embodiments of the invention may be better understood with reference to the figures and discussions that follow.

Figure 3:
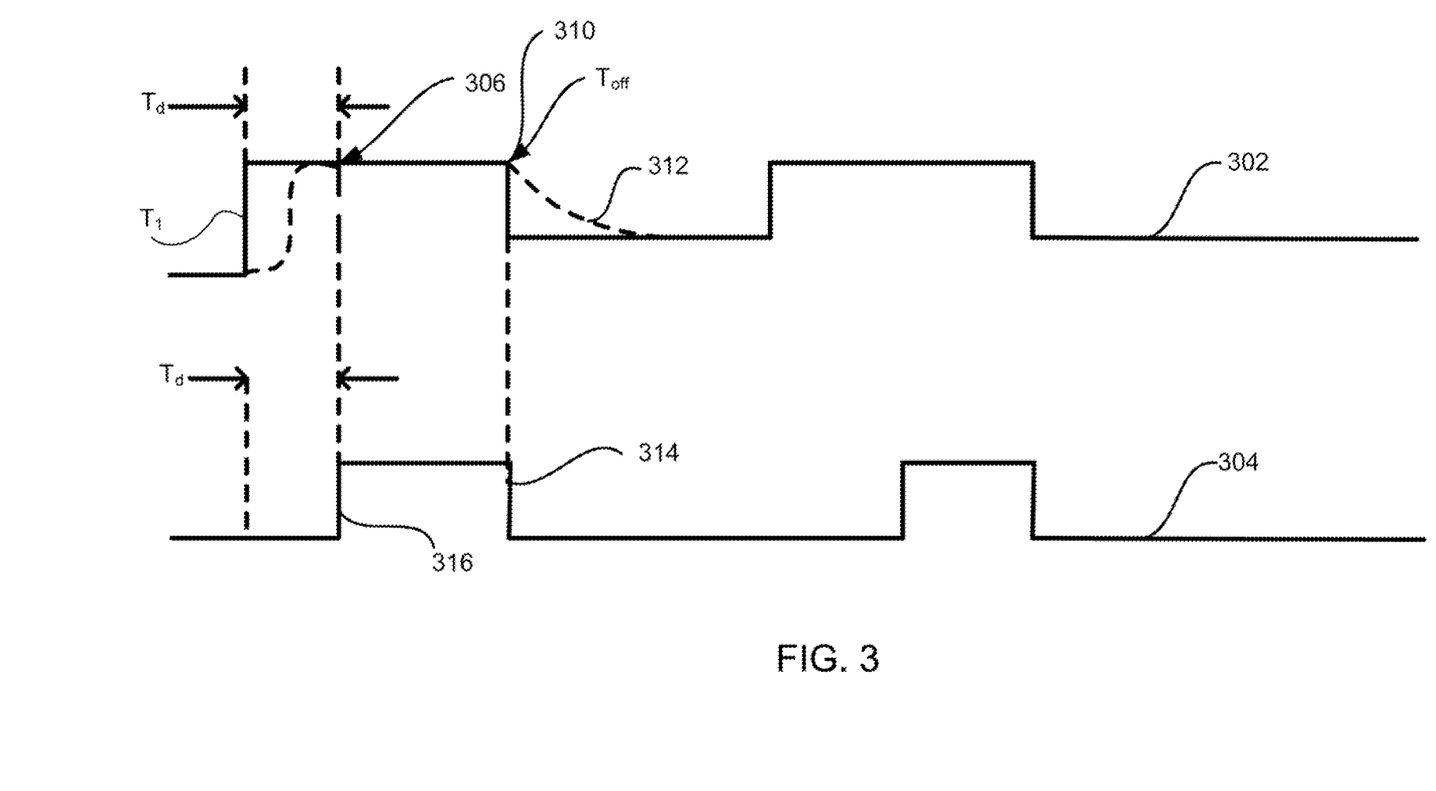
FIG. 3 illustrates, in accordance with one or more embodiments of the invention, the situation wherein the synchronized bias RF signal pulse is both delayed and shortened relative to the source RF signal pulse to advantageously eliminate the aforementioned high bias condition.

With reference to FIG. 3, there is shown source RF signal 302 which is turned on at time $T_1$. After a delay period, $T_d$, the plasma is ignited and the plasma is fully on (reference number 306). The source RF signal is turned on for some time and then turned off at time $T_{off}$ as shown. It should be noted that for ease of reference, the plasma is referred to as "turned on" or "ignited." In some cases, it is possible that the plasma is not extinguished during the low pulse period and the high pulse is configured to provide additional RF energy to the plasma. The invention should be understood to also encompass these situations.

Further, as a matter of terminology clarification, the source RF signal should be understood to be primarily the plasma generating or plasma igniting RF signal and the bias RF signal should be understood to be primarily the signal for providing a bias. "Primary" or "primarily" refer to the relative function between the two RF signals. Thus, in the example of FIG. 3, the source RF signal influences plasma ignition/sustaining to a greater degree than the bias RF signal (hence the source RF signal is discussed as "primarily" the plasma igniting/sustaining RF signal). The bias RF signal influences bias to a greater degree than the source RF signal (hence the bias RF signal is discussed as "primarily" the biasing RF signal). The invention should be understood to also encompass these situations.

Once the source RF signal 302 is turned off, the plasma in the chamber is no longer actively generated, and the generated species decay away during the afterglow period as signified by reference number 312.

To ensure that the bias RF signal is turned on only after the plasma is ignited, embodiments of the invention delay the bias RF signal pulse 304 by at least period $T_d$ in order to ensure that the bias RF signal is turned on (denoted by rising edge 316) only after plasma has been ignited and there is present a high density plasma in the chamber.

At the back end of the pulse, the bias RF signal pulse is turned off at edge 314 before the plasma enters its afterglow phase. In one or more embodiments, it is possible to keep the bias RF signal on for a short period of time after the plasma transitions into the afterglow phase. However, if the bias RF signal is kept on for any significant amount of time after the plasma enters the afterglow phase, there is a risk that the presence of the bias RF signal pulse on the chuck while the high density plasma is no longer present in the chamber would lead to the aforementioned undesirable high bias condition.

Preferably, the bias RF signal can be turned on any time after the plasma is ignited ($T_1$ plus $T_d$) and ends before the transition of the plasma into the afterglow phase (coinciding with the source RF signal turning off at edge 310)

The duration of the bias RF signal may vary between the time $T_1$ plus $T_d$ and $T_{off}$ as required by the recipe.

Figure 5:
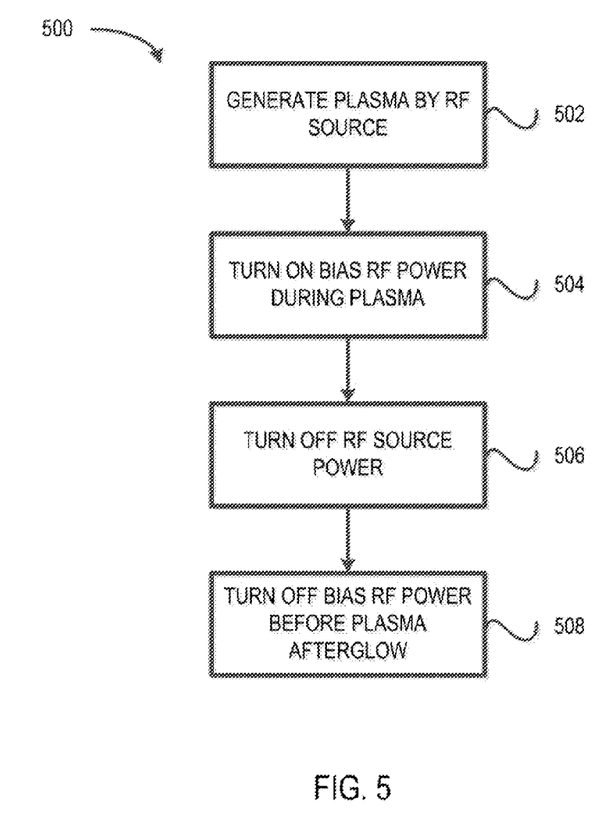
FIG. 5 illustrates a simplified flowchart of a method for processing a substrate in accordance with one or more embodiments of the invention.

In one or more embodiments, edge 314 (representing the bias RF signal turning off) occurs no later than the time when the source RF signal pulse is turned off (time $T_{off}$). For example, reference is made to FIG. 5 for illustrating a flowchart of a process 500 of an illustrated embodiment. Included in the process 500 is a step 502 of generating a plasma by the source RF power supply. Thereafter, the process at step 504 turns on the bias RF power supply during the plasma generated. At step 506 the source RF power supply is turned off. This is followed by step 508 whereat the bias RF power supply is turned off before plasma transitions into an afterglow phase. However, it is entirely possible to turn off the bias RF signal earlier if desired by a recipe. It is also possible to turn the bias RF signal off any time after the plasma is ignited. If too much of the on pulse of the source RF signal is used for the ignition phase and there is little time left of the on pulse devoted to the plasma-on phase, both the plasma-on time (and by extension, the duration of the bias pulse) may be too short to be effective.

In one or more embodiments, it has been discovered that beneficial process results are obtained when the source RF signal is pulsed in the range between about 1 Kilohertz (KHz) and about 20 KHz, with the on pulse lasting a minimum of at least about 10 microseconds and the source RF signal off-time lasting a minimum of at least about 10 microseconds. If the on time is too short, there may not be enough time to ignite the plasma in each pulse. If the pulsing frequency is too slow, the plasma off period may be unduly long, thereby impacting the throughput.

In one or more embodiments, the duty cycle may be between about 10 percent and about 50 percent. In one or more embodiments, the duty cycle may be between about 10 percent and about 90 percent. If the duty cycle is too high, the plasma afterglow period may be insufficient. If the duty cycle is too low, it may be difficult if not impossible to ignite the plasma. The pulsing frequency and duty cycle represent the two control knobs that may, along with the delay time and the turn on and off time of the source RF signal and bias RF signal, be employed to control the pulsing.

Figure 4:
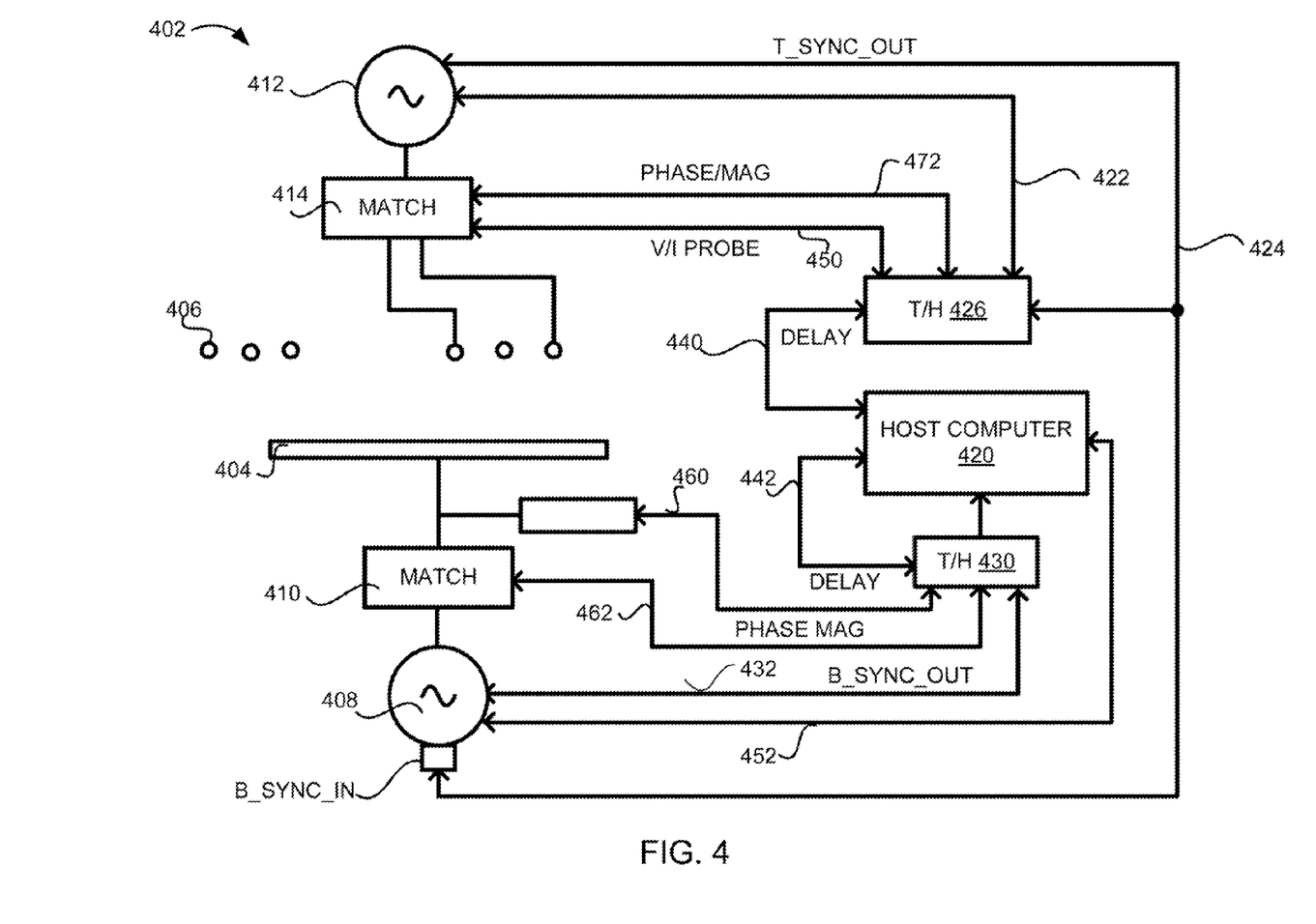
FIG. 4 shows, in accordance with an embodiment of the invention, a simplified conceptual block diagram of a plasma processing system wherein the track-and-hold technique is employed to measure parameters associated with the synchronized and shortened pulses.

FIG. 4 shows, in accordance with an embodiment of the invention, a simplified conceptual block diagram of a plasma processing system wherein a track-and-hold technique is employed to measure parameters associated with the synchronized and shortened pulses. As will be discussed later herein, the use of a track-and-hold technique for measuring parameters for the synchronized and shortened pulses of embodiments of the invention greatly improves accuracy, thereby providing better information for process control and troubleshooting, for example.

With reference to FIG. 4, there is shown a plasma processing system 402, including an inductive TCP (transformer coupled plasma) coil 406. A chuck 404 is employed to support a wafer (not shown) and is powered by a bias generator 408, which provides the bias RF signal via a bias match 410. In the example of FIG. 4, bias generator 408 implements the aforementioned bias RF power supply.

TCP coil 406 represents the inductive source for igniting a plasma inside the chamber to process the wafer. The RF power is generated from a TCP generator 412 and is supplied to coil 406 via a TCP match 414. In the example of FIG. 4, TCP generator 412 represents the aforementioned source RF power supply. The components described thus far are conventional and typical of many inductively coupled plasma processing systems.

A host control system 420 generates a TCP control signal, which includes at least the frequency and duty cycle information for the TCP generator. The TCP control signal is transmitted via a bi-directional link 422 to TCP generator 412. TCP generator 412 acts as a synchronization master in the example of FIG. 4 and generates a T_SYNC_OUT signal, which is transmitted via a link 424 to the B_SYNC_IN port of bias generator 408. Bias generator 408 acts as a synchronization slave and generates its pulses in response to the T_SYNC_OUT signal generated by master TCP generator 412, using a delay value transmitted via a link 452 from host control system 420 to bias generator 408 to account for the aforementioned plasma ignition delay.

In an alternative embodiment, the bias generator may act as a master to control the slave TCP generator. In yet another embodiment, it is contemplated that another external circuit may be employed as the master to generate two independent synchronization signals to control both the slave TCP generator and the slave bias generator.

Bias generator 408 outputs its own B_SYNC_OUT signal, which is transmitted to a bias T/H (track-and-hold) circuit 430 via a link 432. The B_SYNC_OUT signal is employed to trigger bias T/H circuit 430. In a similar manner, the T_SYNC_OUT signal generated by TCP generator 412 is transmitted (via link 424) to the input port of a TCP T/H circuit 426 to be employed to trigger the TCP T/H circuit 426.

In use, host control system 420 sends a TCP delay control signal, which specifies the delay time from the start of the TCP pulse, to the TCP T/H circuit 426 via link 440. This TCP delay control information determines the point in time, relative to the start of the TCP active pulse, that sampling should be taken for the TCP signal. Likewise, host control system 420 sends a bias delay control signal, which specifies the delay time from the start of the bias pulse, to the bias T/H circuit 430 via link 442. This bias delay control information determines the point in time, relative to the start of the bias active pulse, that sampling should be taken for the bias signal.

Further, TCP T/H circuit 426 is shown receiving a V-I probe signal 450 and a Phase/Mag signal 472. TCP T/H circuit 426 is triggered by the T_SYNC_OUT signal (which is received by TCP T/H circuit 426 from TCP generator 412 via link 424) and waits for a delay time specified by the TCP delay control signal (which is received by TCP T/H circuit 426 from host control system 420 via a link 440) before it samples a V-I probe signal 450 and a Phase/Mag signal 472. Although only two signals (V-I probe signal 450 and Phase/Mag signal 472) are shown, TCP T/H circuit 426 may be configured to receive and sample as many different signals as desired.

In one or more embodiments, the TCP delay control signal parameter for the TCP pulse is specified such that the sample is taken only after the plasma is ignited and stabilized but before the TCP RF signal is turned off. For example, a time that is roughly 80 percent of the active bias pulse (i.e., after 80 percent of the active bias pulse has elapsed and only 20 percent of the active bias pulse remains) is suitable for taking a sample for that pulse in one or more embodiments. In one or more embodiments, a time that is roughly between about 50 to about 80 percent of the active bias pulse (i.e., between about 50 percent and 80 percent of the active bias pulse has elapsed) is suitable for taking a sample for that pulse.

Likewise, a bias T/H circuit 430 is shown receiving a V-I probe signal 460 and a Phase/Mag signal 462. Bias T/H circuit 430 is triggered by the B_SYNC_OUT signal (which is received by bias T/H circuit 430 from bias generator 408 via a link 432) and waits for a delay time specified by the bias delay control signal (which is received by bias T/H circuit 430 from host control system 420 via a link 442) before it samples the V-I probe signal 460 and Phase/Mag signal 462. Although only two signals (V-I probe signal 460 and Phase/Mag signal 462) are shown sampled by bias T/H circuit 430, bias T/H circuit 430 may be configured to receive and sample as many different signals as desired.

The bias delay control signal parameter for the bias pulse is specified such that the sample is taken only after the plasma has stabilized but before the TCP signal (and thus active plasma generation) is turned off. As mentioned, a time that is roughly between about 50-80 percent of the active bias pulse (i.e., after about 50 to about 80 percent of the active bias pulse has elapsed) is suitable for taking a sample for that pulse in one or more embodiments.

The sampled values from the various input signals (such as from V-I probe signal 450 or Phase/Mag signal 472 or V-I probe signal 460 or Phase/Mag signal 462) may then be read out as held values (essentially a snapshot) by host control system 420. In this manner, host control system 420 may specify precisely at what point in time in the pulse (relative to the start of the TCP pulse or the start of the bias pulse) the sample should be taken. A snapshot of the value of the input signal (such as from V-I probe signal 450 or Phase/Mag signal 472 or V-I probe signal 460 or Phase/Mag signal 462) may then be taken.

This is unlike the prior art approach wherein the sample may be an average value or may be taken randomly anywhere within the pulse. The track-and-hold technique as disclosed herein is highly advantageous for high frequency pulsing RF signals. This is because the time duration when the plasma is on during each pulse may be very brief and the exact requirements of modern processes may necessitate accurate measurements of chamber conditions during the plasma on times. By providing a way to specify exactly the point in time during each pulse for sampling the sensor signals, embodiments of the invention provides more accurate measurements for chamber control and other purposes, as mentioned earlier.

In one or more embodiments, it is contemplated that multiple samples may be taken at various portions of a pulse (e.g., pre-ignition, start of ignition, steady-state plasma present, start of after-glow, during after-glow, etc.), all of which may be specified by a combination of the trigger signal (e.g., T_SYNC_OUT for the TCP T/H circuit or B_SYNC_OUT for the bias T/H circuit) and one or more delay values. Further, the trigger signals and the delays for the TCP T/H circuit and the bias T/H circuit do not have to be the same or have the same value and sampling at different times by these two track-and-hold circuits 426 and 430 is possible. Further, it is possible in one or more embodiments to sweep a number of samples through one or more pulses to obtain a set of samples to track the response of a given parameter over time, thereby advantageously obtaining the equivalent capability of a sampling scope.

In this manner, the sampled values (e.g., VI-probe, voltage, current, phase, etc.) are more accurate and repeatable from pulse to pulse, thereby providing better information for process control and trouble shooting. The sampled values may then be employed for control, alarm, or other purposes, for example.

As can be appreciated from the foregoing, embodiments of the invention improve etch selectivity (by reducing bombardment) and reduces the risk of damage to the wafer or the chuck when operating in the RF pulsing mode. By both delaying the bias pulse at the front end and shortening the bias pulse at the back end, embodiments of the invention ensure that the high bias condition does not exist or is substantially minimized and that the bias pulse is active only during the time when the plasma is actively generated by the source RF signal. By using a track-and-hold technique that is triggered by the pulses to more accurately measure values from various chamber parameters, improved accuracy in process control, monitoring, and alarm may be achieved.

While this invention has been described in terms of several preferred embodiments, there are alterations, permutations, and equivalents, which fall within the scope of this invention. For example, although the discussion is conducted with the simplification of signals turning on and turning off to create a pulse, a pulse may involve the transition from any arbitrary low value (which may or may not be zero volt) to any arbitrary high value. As another example, although an inductively coupled chamber and more specifically a TCP (transformer coupled plasma) chamber is employed to facilitate discussion in the specification, the invention also applies to other types of plasma chambers such as capacitively coupled chambers (single or multiple RF frequencies), microwave, ECR, etc.

As another example, although the bias RF signal pulse is delayed and shortened in one or more of the examples herein, it is possible to keep the bias RF signal pulse unchanged and instead simply trigger the starting edge of the source RF signal pulse sooner in time (i.e., moving the rising edge of the source RF signal pulse to a point in time ahead of the starting edge of the bias RF signal pulse while keeping their trailing edges aligned). This may be performed using an external circuit as a master circuit to control both the source RF signal supply and the bias RF signal supply as slaves, for example. If the term "set" is employed herein, such term is intended to have its commonly understood mathematical meaning to cover zero, one, or more than one member. The invention should be understood to also encompass these alterations, permutations, and equivalents.

It should also be noted that there are many alternative ways of implementing the methods and apparatuses of the present invention. Although various examples are provided herein, it is intended that these examples be illustrative and not limiting with respect to the invention.

What is claimed is:

1. A method for performing synchronized radio frequency (RF) pulsing between a first RF signal and a second RF signal during substrate processing in a plasma processing chamber, comprising:
  transitioning from low-to-high for said first RF signal;
  thereafter waiting for a delay period after said transitioning from said low-to-high of said first RF signal;
  thereafter transitioning from low-to-high for said second RF signal;
  thereafter transitioning from high-to-low for said second RF signal, wherein said second RF signal is transitioned from said high-to-low before a plasma transitions into an afterglow phase; and
  thereafter transitioning from high-to-low for said first RF signal.

2. The method of claim 1 wherein said first RF signal is a primarily plasma-generating RF signal and said second RF signal is primarily an RF bias signal.

3. The method of claim 1 wherein said first RF signal is primarily an RF bias signal and said second RF signal is primarily a plasma-generating RF signal.

4. The method of claim 1 wherein said transitioning from high-to-low for said second RF signal is performed no later than said transitioning from high-to-low for said first RF signal.

5. The method of claim 1 wherein a generator source of said first RF signal is pulsing with a repetition rate in a range between 1 Kilohertz (KHz) and 20 KHz.

6. The method of claim 1 further including sending a control signal to a first power source, wherein said first power source is configured for generating said first RF signal, said control signal including at least frequency and duty cycle information, wherein said pulsing of said first RF signal is at least 10 microseconds pulsing high and at least 10 microseconds pulsing low for each pulse period, and said duty cycle is between 10 percent and 90 percent.

7. The method of claim 6 further including determining parameters for performing said synchronized RF pulsing, wherein said determining including at least triggering a first circuit after receiving a first synchronization signal, wherein said first circuit is configured at least for receiving a first control, wherein said first control signal specifies a first delay time for gathering data about a first set of sensor signals, receiving a first V-I probe signal and a first Phase/Mag signal, and collecting said data about said first set of sensor signals, wherein said first set of sensor signals including at least one of said first control signal, said first V-I probe signal and said first Phase/Mag signal; and triggering a second circuit after receiving a second synchronization signal, wherein said second circuit is configured at least for receiving a second control signal, wherein said second control signal specifies a second delay time for gathering data about a second set of sensor signals, receiving a second V-I probe signal and a second Phase/Mag signal, and collecting said data about said second set of sensor signals, wherein said second set of sensor signals including at least one of said second control signal, said second V-I probe signal and said second Phase/Mag signal.

8. The method of claim 7 wherein said first time starts after 80 percent of said first RF signal pulse has elapsed.

9. The method of claim 7 wherein said second delay time starts after between 50 to 80 percent of said second RF signal pulse has elapsed.

10. The method of claim 7 wherein said first circuit is a TCP track-and-hold circuit.

11. The method of claim 7 wherein said second circuit is a bias track-and-hold circuit.

12. An arrangement for performing synchronized radio frequency (RF) pulsing during substrate processing of a substrate in a plasma processing chamber of a plasma processing system, comprising:

a power source configured at least for generating a plasma-generating RF signal;

a bias generator configured at least for generating a bias RF signal;

means for creating a set of synchronization signals, said set of synchronization signals configured at least for controlling said power source and said bias generator;

a host control system configured at least for interacting with said means for creating said set of synchronization signals, said interacting including at least sending a first control signal wherein said first control signal includes at least frequency and duty cycle information for creating said plasma-generating RF signal, and sending a delay value for controlling time delay for said generating of said bias RF signal so as to ensure that said bias RF signal is present when a plasma is actively generated by said plasma-generating RF signal and sending a second control signal ending said bias RF signal before said plasma transitions into an afterglow phase.

13. The arrangement of claim 12 wherein said means for creating said set of synchronization signals is one of said power source and said bias generator.

14. The arrangement of claim 12 wherein said means for creating said set of synchronization signals is an independent circuit configured for controlling said power source and said bias generator.

15. The arrangement of claim 12 wherein said power source is a TCP generator.

16. The arrangement of claim 12 wherein said power source pulses with a repetition rate in a range between about 1 Kilohertz (KHz) and about 20 KHz.

17. The arrangement of claim 12 wherein said RF pulsing of said plasma-generating RF signal is at least 10 microseconds pulsing high and at least 10 microseconds pulsing low for each pulse period.

18. The arrangement of claim 12 wherein said duty cycle is between 10 percent and 90 percent.

19. A method for performing synchronized radio frequency (RF) pulsing during substrate processing in a plasma processing system, comprising:

sending a first control signal, wherein said first control signal including at least frequency and duty cycle information for a first power source;

generating a first RF signal configured at least for generating a plasma;

transitioning from low-to-high for said first RF signal;

waiting for a delay period before igniting said plasma;

generating a first synchronization signal to a second power source after a delay value, said delay value is employed for controlling time delay for generating a second RF signal;

generating said second RF signal;

transitioning from low-to-high for said second RF signal;

transitioning from high-to-low for said second RF signal, wherein said second RF signal is transitioned from said high-to-low before said plasma transitions into an afterglow phase; and transitioning from high-to-low for said first RF signal.

20. The method of claim 19 wherein said first RF signal is a primary plasma-generating RF signal and said second RF signal is an RF bias signal.

21. The method of claim 19 wherein said first RF signal is an RF bias signal and said second RF signal is a primary plasma-generating RF signal.

22. The method of claim 19 wherein said first RF signal is a high frequency signal and said second RF signal is a low frequency RF signal.

23. The method of claim 19 wherein said transitioning from high-to-low for said second RF signal is performed no later than said transitioning from high-to-low for said first RF signal.

24. The method of claim 19 wherein said pulsing of said first RF signal is at least 10 microseconds pulsing high and at least 10 microseconds pulsing low for each pulse period.

25. The method of claim 19 wherein said duty cycle is between 10 percent and 90 percent.

26. The method of claim 19 further including determining parameters for performing said synchronized RF pulsing, wherein said determining including at least triggering a first circuit after receiving a second synchronization signal, wherein said first circuit is configured at least for receiving a first control signal, wherein said first control signal specifies a first delay time for gathering data about a first set of sensor signals, receiving a first V-I probe signal and a first Phase/Mag signal, and collecting said data about said first set of sensor signals, wherein said first set of sensor signals including at least one of said first control signal, said first V-I probe signal and said first Phase/Mag signal; and triggering a second circuit after receiving a third synchronization signal, wherein said second circuit is configured at least for receiving a second control signal, wherein said second control signal specifies a second delay time for gathering data about a second set of sensor signals, receiving a second V-I probe signal and a second Phase/Mag signal, and collecting said data about said second set of sensor signals, wherein said second set of sensor signals including at least one of said second control signal, said second V-I probe signal and said second Phase/Mag signal.

27. The method of claim 26 wherein said first delay time starts after 80 percent of said first RF signal pulse has elapsed.

28. The method of claim 26 wherein said second delay time starts after 80 percent of said second RF signal pulse has elapsed.

29. The method of claim 26 wherein said first circuit is a TCP track-and-hold circuit.

30. The method of claim 26 wherein said second circuit is a bias track-and-hold circuit.

* * * * *